United States Patent
Husher

(10) Patent No.: US 7,183,193 B2
(45) Date of Patent: Feb. 27, 2007

(54) INTEGRATED DEVICE TECHNOLOGY USING A BURIED POWER BUSS FOR MAJOR DEVICE AND CIRCUIT ADVANTAGES

(75) Inventor: John Durbin Husher, Los Altos Hills, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/669,762

(22) Filed: Sep. 24, 2003

(65) Prior Publication Data

US 2004/0092094 A1    May 13, 2004

Related U.S. Application Data

(63) Continuation-in-part of application No. 10/034,184, filed on Dec. 28, 2001, now abandoned.

(51) Int. Cl.
*H01L 21/4763* (2006.01)
*H01L 21/44* (2006.01)

(52) U.S. Cl. ............... 438/618; 438/652; 257/E21.575

(58) Field of Classification Search ............... 438/618, 438/620, 629, 642, 652, 672
See application file for complete search history.

(56) References Cited

U.S. PATENT DOCUMENTS

| | | | | |
|---|---|---|---|---|
| 4,764,804 A | * | 8/1988 | Sahara et al. ............... 257/717 |
| 4,933,743 A | | 6/1990 | Thomas et al. ............. 257/742 |
| 5,213,999 A | * | 5/1993 | Sparks et al. ............... 438/639 |
| 5,369,291 A | | 11/1994 | Swanson ..................... 257/130 |
| 5,436,190 A | | 7/1995 | Yang et al. .................. 438/296 |
| 5,450,283 A | * | 9/1995 | Lin et al. ..................... 361/704 |
| 5,612,567 A | | 3/1997 | Baliga ......................... 257/475 |
| 5,614,750 A | * | 3/1997 | Ellul et al. .................. 257/386 |
| 5,629,238 A | * | 5/1997 | Choi et al. .................. 438/645 |
| 5,654,232 A | * | 8/1997 | Gardner ...................... 438/661 |
| 5,691,555 A | | 11/1997 | Zambrano et al. .......... 257/332 |
| 5,757,081 A | | 5/1998 | Chang et al. ............... 257/778 |
| 5,844,273 A | | 12/1998 | Konishi ...................... 257/331 |
| 5,894,140 A | | 4/1999 | Terasawa .................... 257/147 |
| 5,903,031 A | | 5/1999 | Yamada et al. ............. 257/356 |
| 5,929,482 A | | 7/1999 | Kawakami et al. ......... 257/328 |
| 5,972,786 A | * | 10/1999 | Hoshino et al. ............ 438/627 |

(Continued)

OTHER PUBLICATIONS

U.S. Appl. No. 10/034,067, filed Dec. 28, 2001.*

(Continued)

*Primary Examiner*—Lex H. Malsawma
(74) *Attorney, Agent, or Firm*—Sawyer Law Group LLP

(57) ABSTRACT

A method for providing an improved integrated circuit device is disclosed. The method comprises the steps of providing active and passive areas in the substrate, providing a plurality of slots in the substrate after providing the active and passive areas, and oxidizing the plurality of slots. The method further comprises providing metal in each of the plurality of slots, providing a dielectric coating over the slots, and providing etched contacts in select areas remote from the location of the slots. Additionally, the method provides an additional layer of metal that interconnects the contacts and the buried metal in select areas where contacts were etched, resulting in metal of three levels; and provides one level of the metal is surface and two levels of the metal that comprise a buried power buss (BPB).

8 Claims, 15 Drawing Sheets

U.S. PATENT DOCUMENTS

| | | | |
|---|---|---|---|
| 6,008,127 A | 12/1999 | Yamada | 438/694 |
| 6,020,600 A | 2/2000 | Miyajima et al. | 257/76 |
| 6,077,768 A * | 6/2000 | Ong et al. | 438/622 |
| 6,090,699 A * | 7/2000 | Aoyama et al. | 438/622 |
| 6,184,124 B1 * | 2/2001 | Hasegawa et al. | 438/625 |
| 6,235,567 B1 | 5/2001 | Huang | 438/202 |
| 6,281,029 B1 | 8/2001 | Goruganthu et al. | 438/18 |
| 6,369,425 B1 | 4/2002 | Ferla et al. | 257/341 |
| 6,548,364 B2 | 4/2003 | Hsu | 438/311 |
| 6,882,053 B1 * | 4/2005 | Husher | 257/758 |
| 6,894,393 B1 * | 5/2005 | Husher | 257/773 |
| 2001/0055861 A1 | 12/2001 | Patti et al. | 438/524 |
| 2002/0175378 A1 | 11/2002 | Choe et al. | 257/355 |
| 2002/0195653 A1 * | 12/2002 | Huang | 257/329 |
| 2005/0074966 A1 * | 4/2005 | Rhodes | 438/629 |

OTHER PUBLICATIONS

U.S. Appl. No. 10/034,279, filed Dec. 28, 2001.*

* cited by examiner

Typical Oxidized Slot showing Width (W) equal to depth (D)

Metal Folding in Slot to give double Thickness of Metal at Slots

After Metal 1A Deposition

After Planarization - Metal Removed from Field (no masking) Some Resist remains in Slot areas and is Resist Stripped Metal (3 layers - 1A, 1B, 1C) Shown in Power Buss

INTEGRATED DEVICE TECHNOLOGY USING A BURIED POWER BUSS FOR MAJOR DEVICE AND CIRCUIT ADVANTAGES

CROSS-REFERENCE TO RELATED APPLICATIONS

The present application is a continuation-in-part of U.S. patent application Ser. No. 10/034,184 filed Dec. 28, 2001 now abandoned.

FIELD OF THE INVENTION

The present invention relates generally to high-current, high-power integrated devices, and more particularly, to providing a buried power buss in combination with several design rule changes to provide significant improvement in parameters, reduction in die size, and other advantages for integrated circuits of various technologies.

BACKGROUND OF THE INVENTION

Presently there is a great deal of work being done on the use of a damascene metal scheme, whereby copper is used to provide a low-resistance, metal interconnect, or power buss, on a semiconductor device. This approach is being used for high-current, high-power devices, as well as for high-frequency devices, to lower their interconnect sheet resistance and RC time-constant, to improve speed. The damascene metal scheme is solely an interconnect scheme, and does not improve the parameters or performance of the individual devices. In addition, it is costly in terms of both equipment requirements and process requirements.

What is described here is an approach that reduces the resistance of interconnects and the RC time-constants, while providing improved device parameters and performance, using standard metallization with fewer process steps, and at less cost. This approach results in reduced die size, with the various advantages associated with a smaller die for a given function.

SUMMARY OF THE INVENTION

A method for providing an improved integrated circuit device is disclosed. The method comprises the steps of providing active and passive areas in the substrate, providing a plurality of slots in the substrate after providing the active and passive areas, and oxidizing the plurality of slots. The method further comprises providing metal in each of the plurality of slots, providing a dielectric coating over the slots, and providing etched contacts in select areas remote from the location of the slots. Additionally, the method provides an additional layer of metal that interconnects the contacts and the buried metal in select areas where contacts were etched, resulting in metal of three levels; and provides one layer on a top surface comprising one layer that is buried comprising two layers of metal buried power buss (BPB).

APPROACH AND IMPROVEMENT OF DESIGN RULES FOR ACTIVE DEVICES

Standard Approach:

The standard approach for the various technologies to be discussed: employ a low resistance substrate, a buried layer, Up isolation, high-resistance epitaxial material, junction isolation, a sinker process, and the various processes for forming the various active devices (Bipolar—Emitter, Base, Collector; CMOS—Source/Drain, Gate, Many, BiCmos—combination of the previous two mentioned; BCD—combination of the previous two mentioned: plus a body diffusion). These approaches employ junction isolation which requires significant use of space since the junction diffuses laterally, at the same time as it is being diffused through the epitaxial layer. These processes are followed by a combination of contact opening, and thin metal deposition, followed by a dielectric deposition, another contact opening, and a thicker second metal for dual layer processes. They require even additional processing for triple metal processes.

In these standard approaches, the design rules must take into account the significant lateral diffusion of the boron junction isolation being formed; during the long-time and high-temperature diffusion. The design rules must allow for a large space between the isolation diffusion and any of the active areas within the integrated circuit. If this diffusion intercepts any of the active areas, it will result in a low breakdown, or electrical shorting. In most of these approaches a sinker is also employed, which also requires a long-time and high-temperature diffusion of phosphorus. The design rules for the sinker process require a large space between this diffusion, other active or passive areas, and the isolation diffusion.

Buried Power Buss (BPB) Approach

Figure 1:
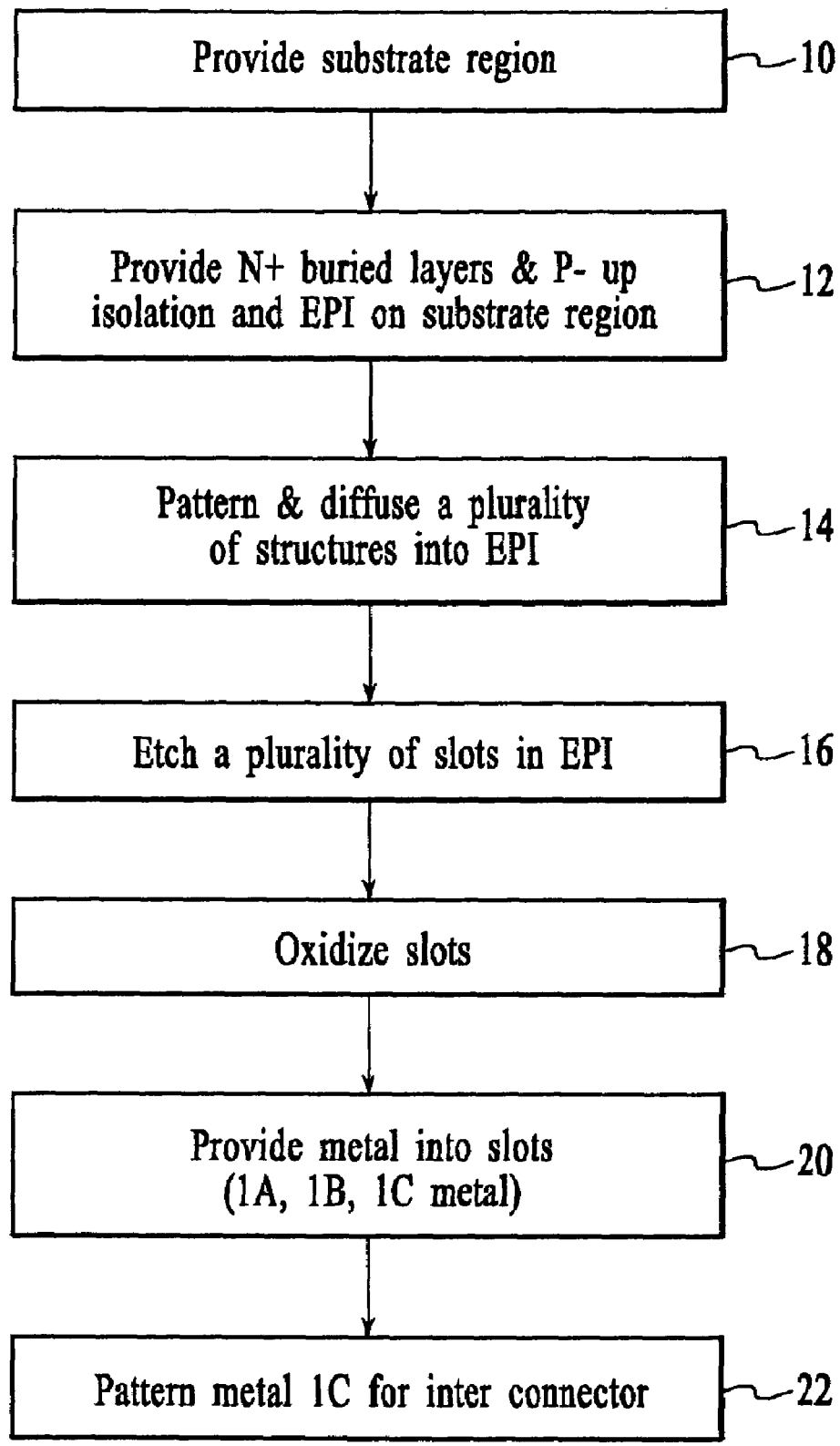
FIG. 1 is a flow chart for providing the buried power buss approach in accordance with the present invention.

FIG. 1 is a flow chart for providing the buried power buss approach in accordance with the present invention. In the approach to be presented here, the isolation and the sinker processes are eliminated. This removes the two highest temperatures and longest time processes, thus significantly reducing the time/temperature budget required. Elimination of these two processes results in terrific space savings. The buried power buss (BPB) process results in oxide-isolated structures without any additional steps to provide this isolation. Because of the oxide isolation and reduced thermal budget, one does not have to take into account the significant sideways encroachment that occurs with junction isolation. Therefore the critical design rules that relate to spacing between active and passive areas can be greatly reduced. In the ultimate, the oxide isolated structures can be designed with design rules that allow the structures to contact the other active or passive structures in the integrated circuit without concern of low breakdown or shorts. These significant reductions in critical design rule spacing results in a much smaller die for a given function. This oxide-isolated structure is unique, in that, it automatically comes as part of the buried power buss (BPB) structure without additional processing. The sinker is automatically provided by the processing of the buried power buss (BPB) without providing for a separate sinker process. Eliminating the sinker is significant since it eliminates the requirement for critical dimension spacing between it and other active or passive elements of the integrated circuit.

Process Flow

As indicated, the parametric advantages discussed are obtained by proper selection and location of the slots of the buried power buss (BPB) in each structure or structures.

The process flow of the buried power buss (BPB) approach remains essentially the same as the standard approach it is replacing, while eliminating the isolation and sinker, in all the technologies indicated up to the processing of the contact mask and metal. At this point, the contact mask and standard metal approach is replaced with the processing of the buried power buss (BPB). Although the process is essentially the same up to this point, the mask set must be changed in order to take advantage of the reduced spacing between active and passive areas and the many other advantages available, including improving the parameters of the active devices and reducing the die size. Critical spacing is reduced significantly due to the dropping of several high-temperatures, long time processes, while achieving oxide isolation. Other than masks being eliminated and critical spacing dimensions being reduced, one moves through the standard process from starting wafer to buried layer, to epitaxial (up isolation may be retained if used in the standard process), to the active area processing, and up to where the contact mask and first metal is normally processed. In the embodiment presented here, the standard contact mask and first metal is not processed as well as the second metal processing for a dual metal approach and the triple metal processing for a triple metal approach.

For a more detailed description of the features of the present invention, refer now to the following description in conjunction with the accompanying figures. FIG. 1 is a simple flow chart for providing a buried power buss or interconnect in accordance with the present invention.

Figure 2A:
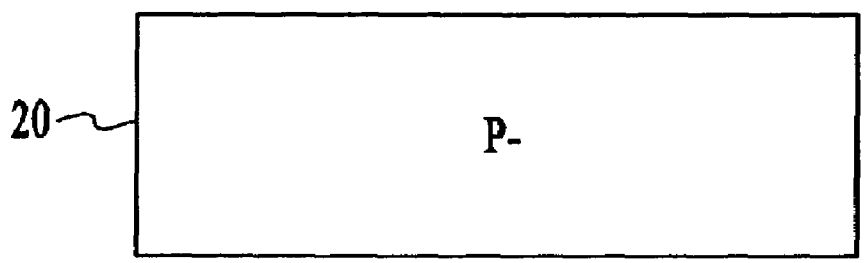
FIG. 2a illustrates a high resistivity p-type substrate region of a semiconductor device.
Figure 2B:
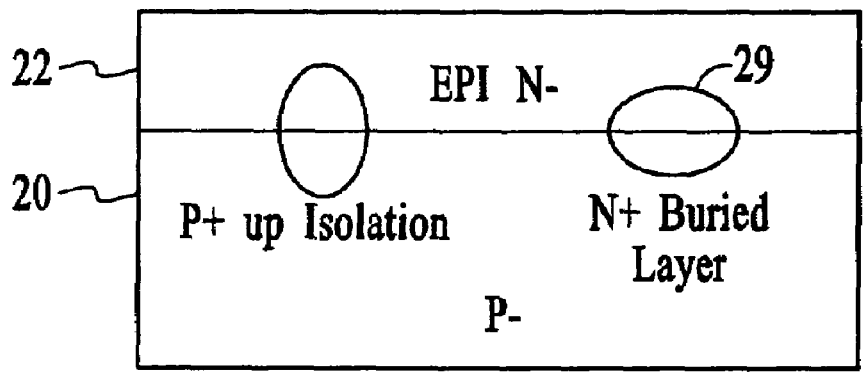
FIG. 2b illustrates an N+ buried layer (and possible location of a P+ up isolation) with an epitaxial (EPI) N-layer being provided on top of the substrate region.
Figure 2C:
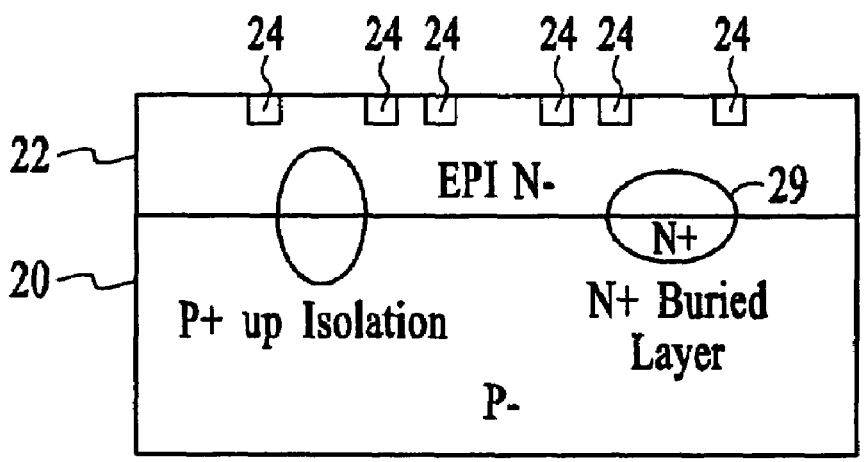
FIG. 2c illustrates a plurality of structures formed (masked and diffused) into the EPI layer to provide the active and passive regions for bipolar, CMOS, BiCMOS, BCD, DMOS, and Schottky devices.
Figure 2D:
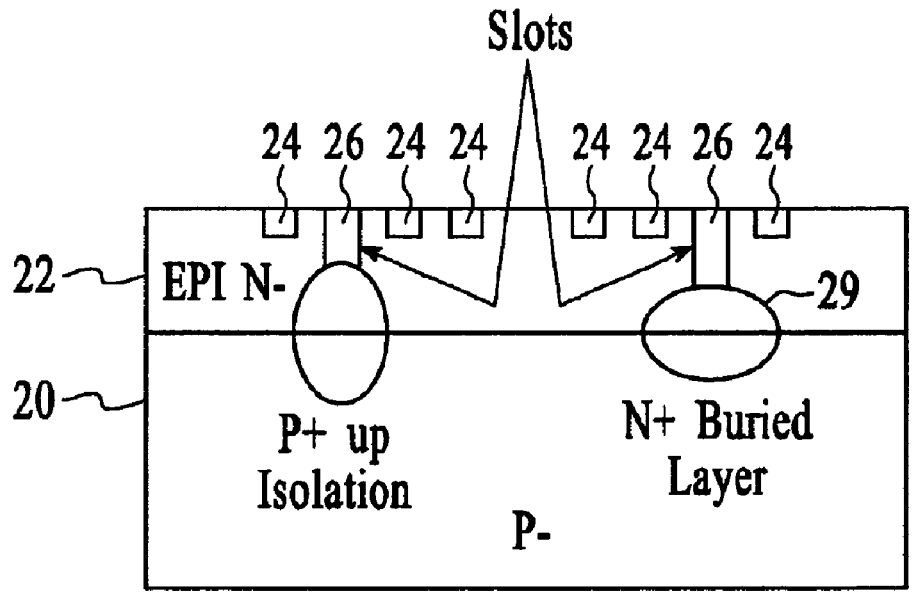
FIG. 2d illustrates a plurality of slots provided down to the substrate between the structures. Shown without up P-type isolation, which could be located under the slots at the interface between the substrate and EPI, just as the buried layer is shown. The slots could then be made shallower to meet the up isolation.
Figure 2E:
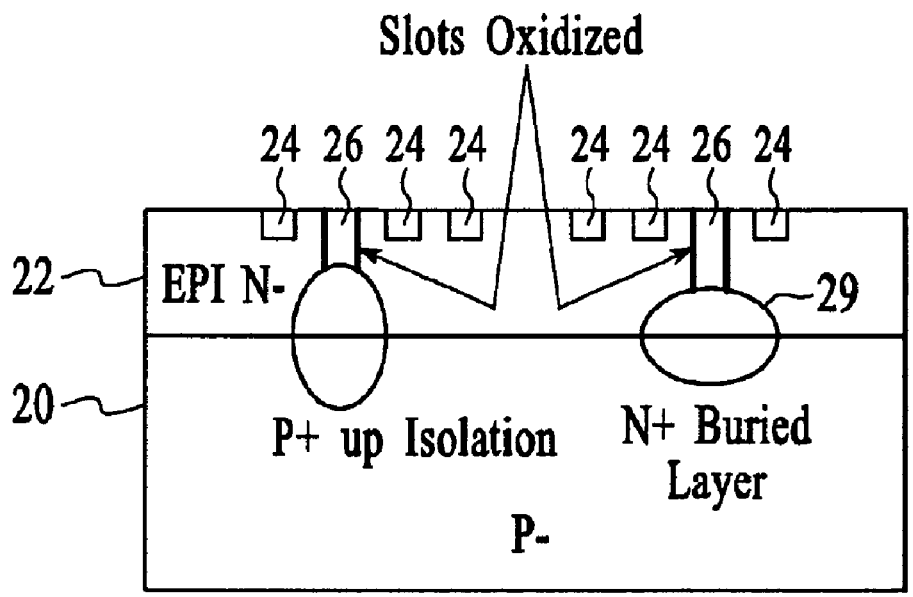
FIG. 2e illustrates the slots after oxidation.
Figure 2F:
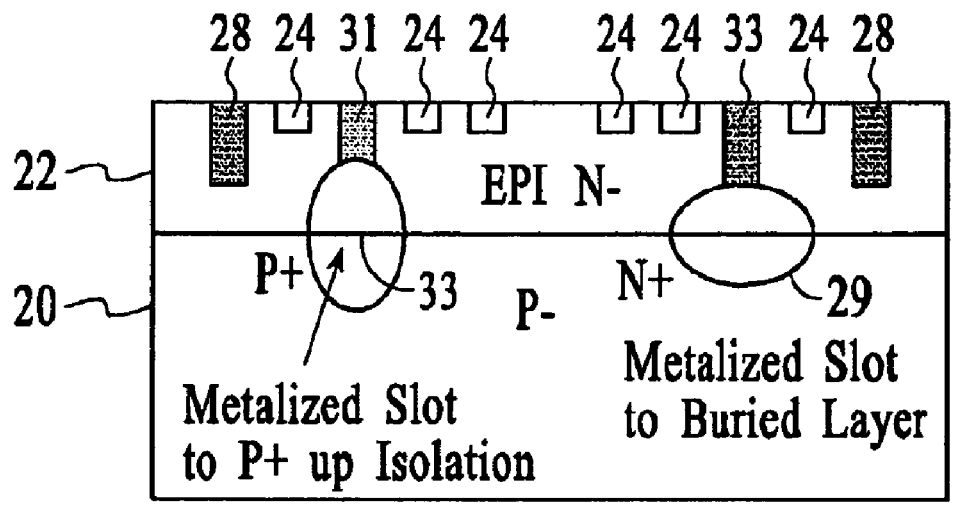
FIG. 2f illustrates oxide removed from the bottom of a typical slot, where metal is to make contact to a grounded substrate, or when the metalized slot is to make contact to the buried layer, to replace the sinker process.
Figure 2G:
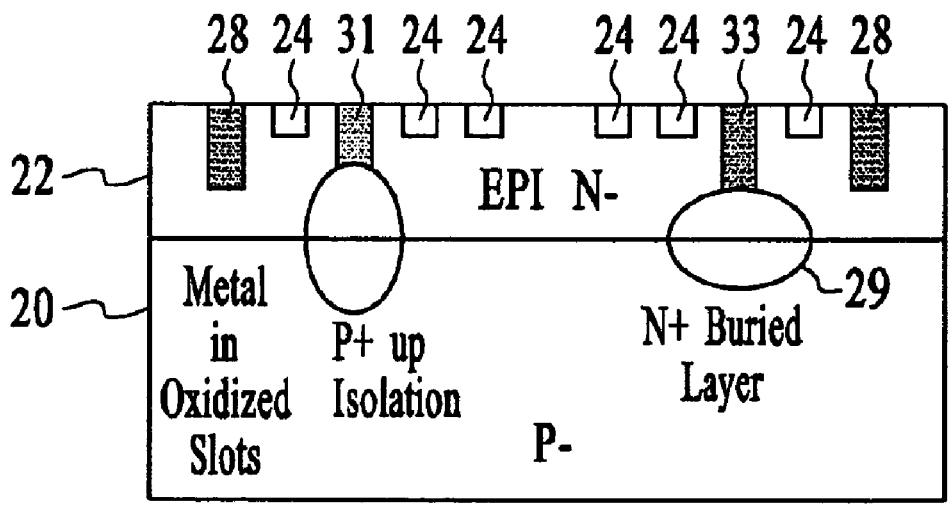
FIG. 2g illustrates metal provided into the slots to provide the power busses.

First, a substrate region 20 (FIG. 2A) is provided, via step 10. Next, a buried layer is placed into the substrate at a plurality of locations and an epitaxial (EPI) layer 22 (FIG. 2B) is provided, via step 12. Thereafter, a plurality of structures 24 (FIG. 2C) are processed into the EPI layer 22 to provide the semiconductor device, via step 14. Next, a plurality of slots 24 are provided down to the substrate region 20 between structures 24 (FIG. 2D), via step 16. Thereafter, the slots 26 are oxidized 27 (FIG. 2E), via step 18. Then, metal 28 is provided into the slots to provide the power busses (FIG. 2F), via step 20. Finally, the metal is patterned for inter connector, via step 22.

At this point a buried power buss (BPB) structure is introduced. This method employs slot etching, slot oxidation, and metal deposition within those slots. These oxidized slots are located wherever high current is intended to flow. This includes the ground slots, the power supply slots, the sinker locations, and the emitter locations for Bipolar, BiCmos, and BCD technologies. Slots are also located at the drains of CMOS, their grounded sources, and between the P and N channel complementary outputs. Slots are located for Schottky diodes at select points to provide low leakage. Slots are also employed wherever it is desired to have the first metal routed (BPB metal) and isolated from the subsequent metal of the power buss (PB) metal.

Figure 3:
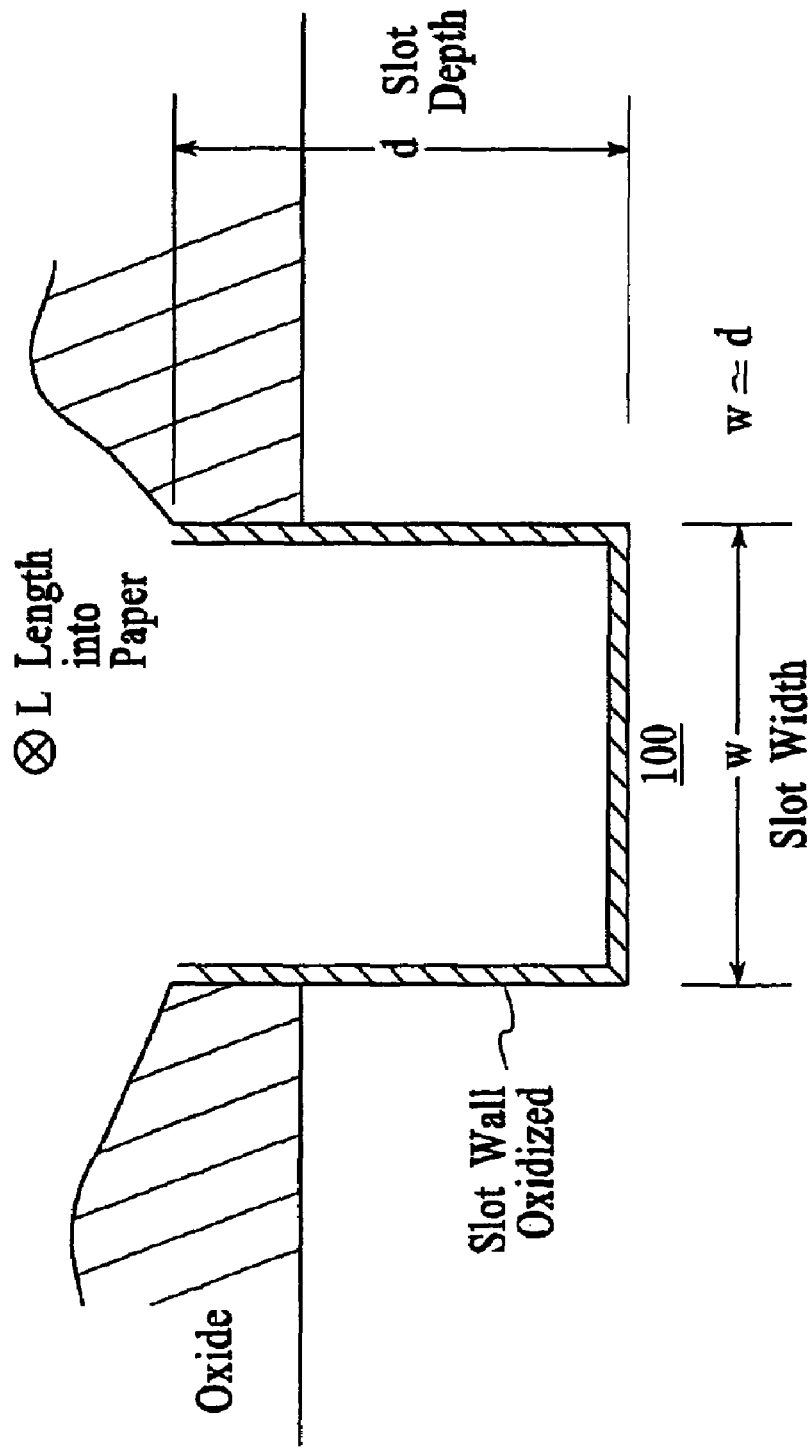
FIG. 3 illustrates a typical oxidized slot with an aspect ratio of one.

A typical oxidized slot cross section is shown in FIG. 3. The slot is made up of a W (width) dimension, a D (depth) dimension, and an L (length) dimension. Notice that the L dimension is shown in FIG. 3 as an arrow going into the paper. This length is dependent on the devices and circuit configuration. The W and D dimensions are determined by the process objectives for the given technology and are constant for that given technology. In all cases, the aspect ratio, or ratio of the D (depth) to the W (width), is equal to or less than one (1). This is to facilitate the metal filling the slots. The actual dimensions that make up the slot are directly related to the technology being processed, the thickness of metal desired, the structures for obtaining parametric advantages, and certain criteria within that technology.

In most cases, the depth is determined by the thickness of the epitaxial layer and whether up isolation is employed. Typical dimensions for various technologies as a function of the epitaxial thickness and whether up isolation is needed, are listed in Matrix 1 below. In most applications, one wants the slot to make it through the epitaxial layer to the substrate to provide a direct contact for ground. When up isolation is employed, the slot must make it to the point where the up isolation has diffused during the growing of the epitaxial layer. The metalized slot meeting this point provides a short to the substrate for an ideal ground.

Matrix 1

| Technology | Epitaxial Thickness | Up Isolation | Slot depth |
|---|---|---|---|
| Bipolar | <3 um | no | <3 um |
| Bipolar | 3 um | no | 3 um |
| Bipolar | 3 um | yes | 1.5 um |
| Bipolar | 5 um | yes | 3 um |
| Bipolar | 6 um | yes | 3 um |
| Bipolar | 7 um | yes | 3.5 um |
| Bipolar | >7 um | yes | ½ epi thickness |
| CMOS | <3 um | no | <3 um |
| BCD | Same as Bipolar | | |
| BiCmos | Same as Bipolar | | |

For these examples the W (width) of the slot would be approximately 1.5 to 2.0 times the D (depth) i.e., an aspect ratio D/W of 0.5 to 0.67. The example shown in FIG. 3 has an aspect ratio of one (1) where the W is shown equal to the D.

Placement of Slots

Properly placed, the slots of the buried power buss (BPB) provide an ideal ground for the emitter of a vertical NPN transistor. It also provides an ideal emitter and ground for a lateral PNP transistor. This is significant in power integrated circuits, since high current in the emitter tends to de-bias the emitter, resulting in a high loss in the emitter due to uneven current flow in the emitter. The de-biasing results in disproportional bias of the base emitter junctions, resulting in reduced beta and causing emission that is uneven and very inefficient. Use of the technique described here results in proportional current flow in the emitter and therefore higher gain and lower Ron (on resistance of the transistor in question).

Figure 12:
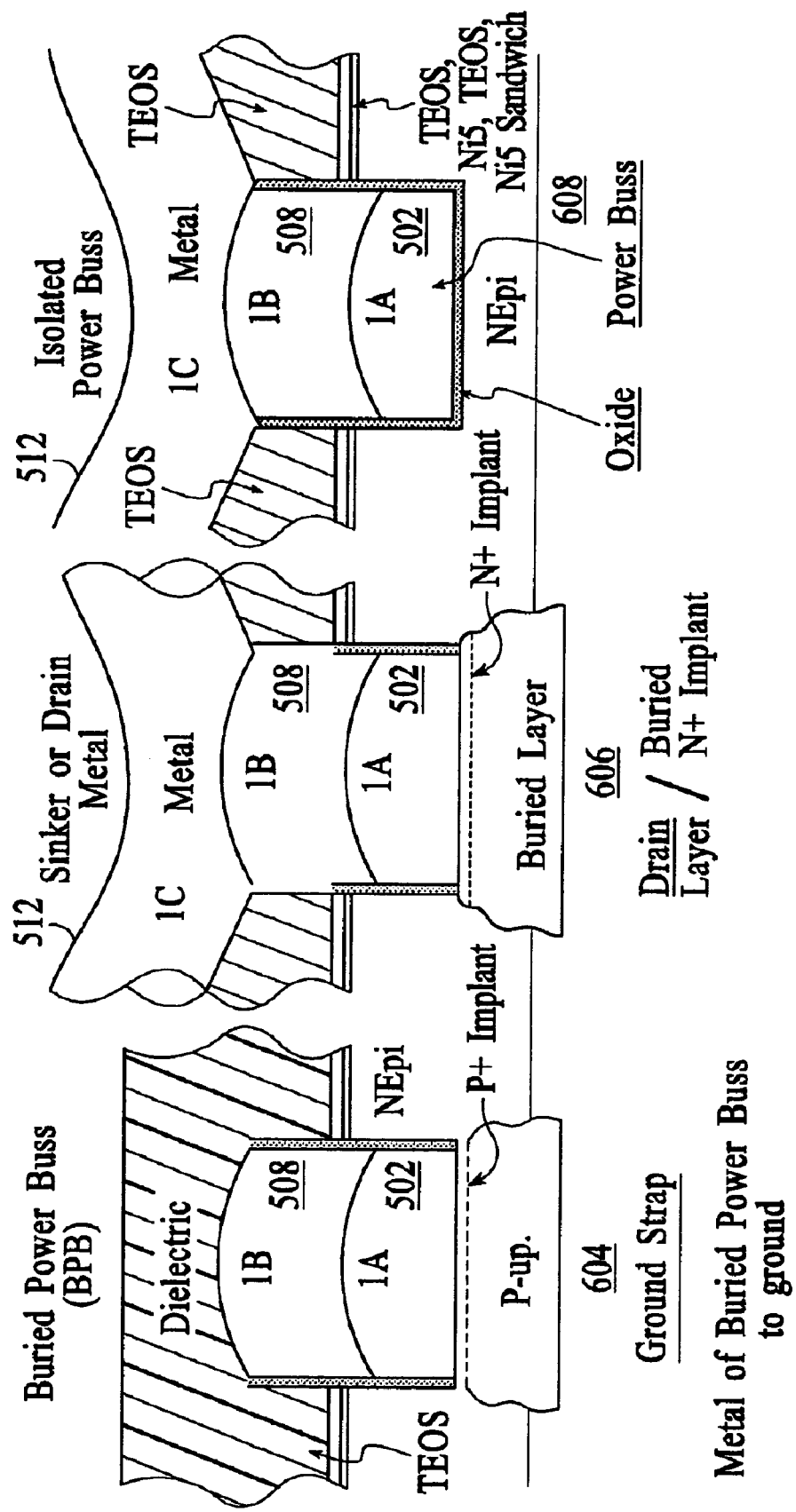
FIG. 12 illustrates an enlarged view of a typical ground strap in the slot to the substrate with oxide removed at the bottom of the slot formed by the BPB, a typical sinker (collector/drain) metal in the slot to the buried layer with an N+ implant and the oxide removed from the bottom of the slot, and a power buss with the oxide retained at the bottom of the slot providing isolated triple metal for the PB. The BPB and its two metals are shown on FIG. 10A with a dielectric separating it from the 1C layer. The PB with its three layers, including 1C, is shown in 10B.

In all integrated circuits, it is of prime importance to provide a solid low-resistance ground. Use of the buried power buss (BPB), with its dielectrically isolated structure, is ideal. FIG. 12 shows how the buried power buss (BPB) is positioned for grounding. This figure also shows the positioning of the buried power buss (BPB) for providing the isolation, the sinker and the power buss. Note that in the application for ground the oxide is removed from the bottom of the slot. This allows the subsequent metal in the slot to make direct contact to the substrate. Reduced resistance is further obtained by implanting P+ in the bottom of the slot for ideal ground. Reduced resistance is obtained for the sinker application by implanting N+ in the bottom of the sinker slot prior to metal deposition. Grounding results in metal from an active region directly to the substrate, as compared to diffused isolation which has a diffused region from the active regions to the substrate. The resistivity of metal is much lower than that of a diffused region, and therefore there is a much lower resistance to ground in this approach versus a diffused approach. This approach therefore results in a more solid ground and reduction of ground noise. Likewise, the metal sinker provides a lower resistance for the collector in a bipolar device and lower resistance drain in an MOS or CMOS device.

Use of the buried power buss (BPB) for the bipolar collector (sinker), results in lower collector capacitance to ground and lower capacitance collector to base. Likewise, when used for the drain of a CMOS transistor, it results in lower capacitance to ground and lower capacitance drain to gate.

In CMOS integrated circuits where an isolation diffusion, or sinker diffusion are not required, there are other parametric advantages gained by placing slots for the buried power buss (BPB) in select locations. The contact from drain directly to a buried layer results in lowering the ON resistance significantly (see FIG. 12). The drains of the complementary P channel and N channel can be moved closer together via a shared oxidized slot filled with metal, resulting in significant space savings and reduced on resistance. This also reduces the output resistance from the output of the complementary MOS to the load and lowers the capacitance output-to-ground, resulting in lower RC time constants. Use of this technique reduces the size of any CMOS circuit, whether it is used in analog power applications or digital high-speed applications.

Similar parametric advantages occur with a lateral DMOS and vertical DMOS. In addition, use of the buried power buss (BPB) results in raising the sustaining current and voltage in both of these technologies.

Forming the Slots

After completion of the processing of the active areas for the given technology, the slots of the buried power buss (BPB) are formed by standard masking and anisotropic dry processing techniques for etching the oxide and silicon. This is followed by oxidation of the slots by either thermal oxidation or a deposited oxide, or deposition of another dielectric. Upon completion, one is left with an ideal oxide or dielectric insulated slot, which, when filled with metal, provides metal that is insulated from all other parts of the circuit. Whenever it is desired to make contact from the bottom of the slot to an underlying layer, the oxide is removed from the bottom of the slot by anisotropic etching such as that done with dry plasma etch.

Oxidized slots are shown in FIG. 12, as well as oxidized slots with the bottom oxide removed.

Providing Metal in the Slots

Metal is placed in the slots by several methods, and two approaches will be discussed here.

Figure 4:
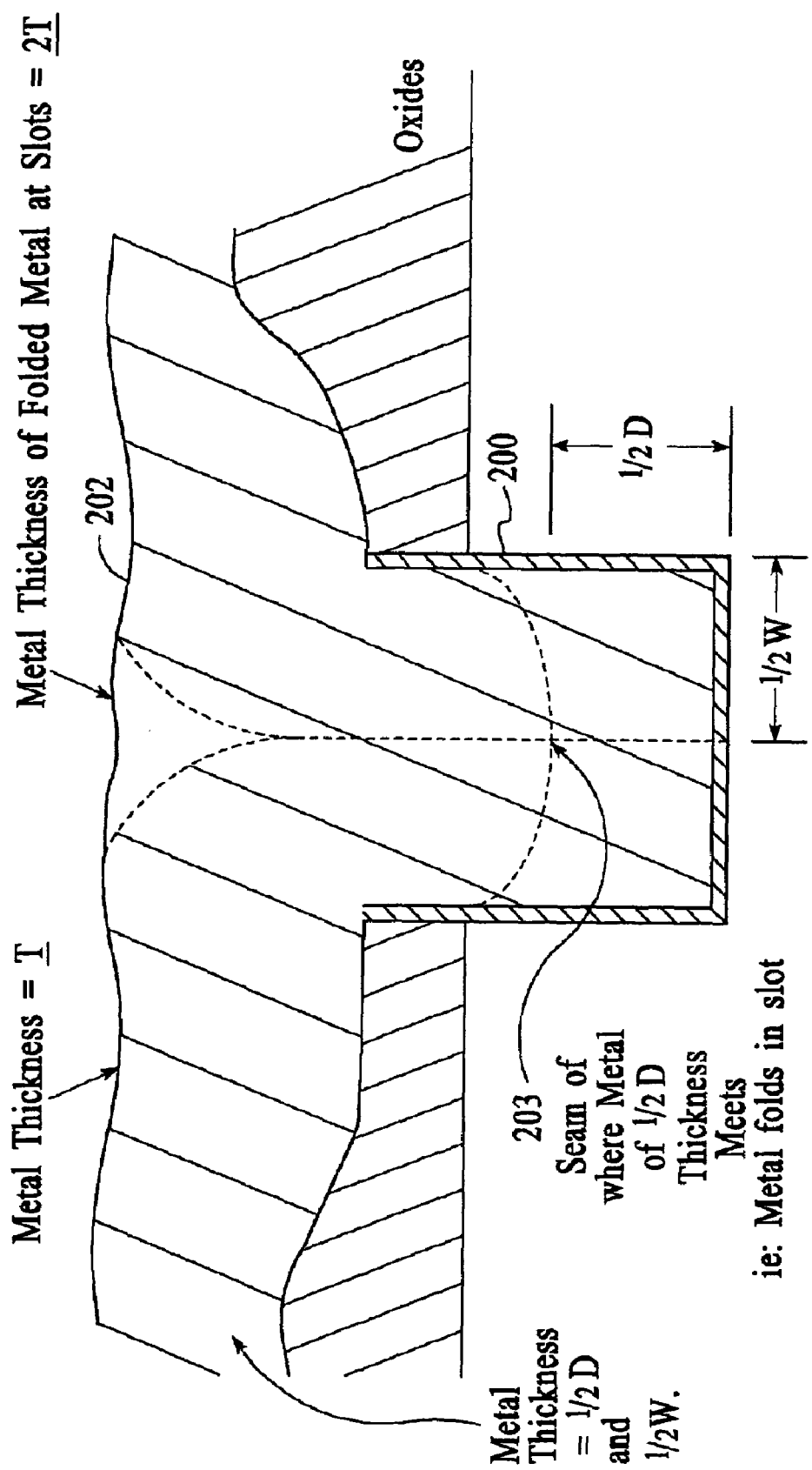
FIG. 4 illustrates a slot that is filled with metal, done with a CVD metal system that provides conformal coating. Folding of the metal in the slot results in it filling the slot with 2× metal thickness when 1× metal is deposited.
Figure 5:
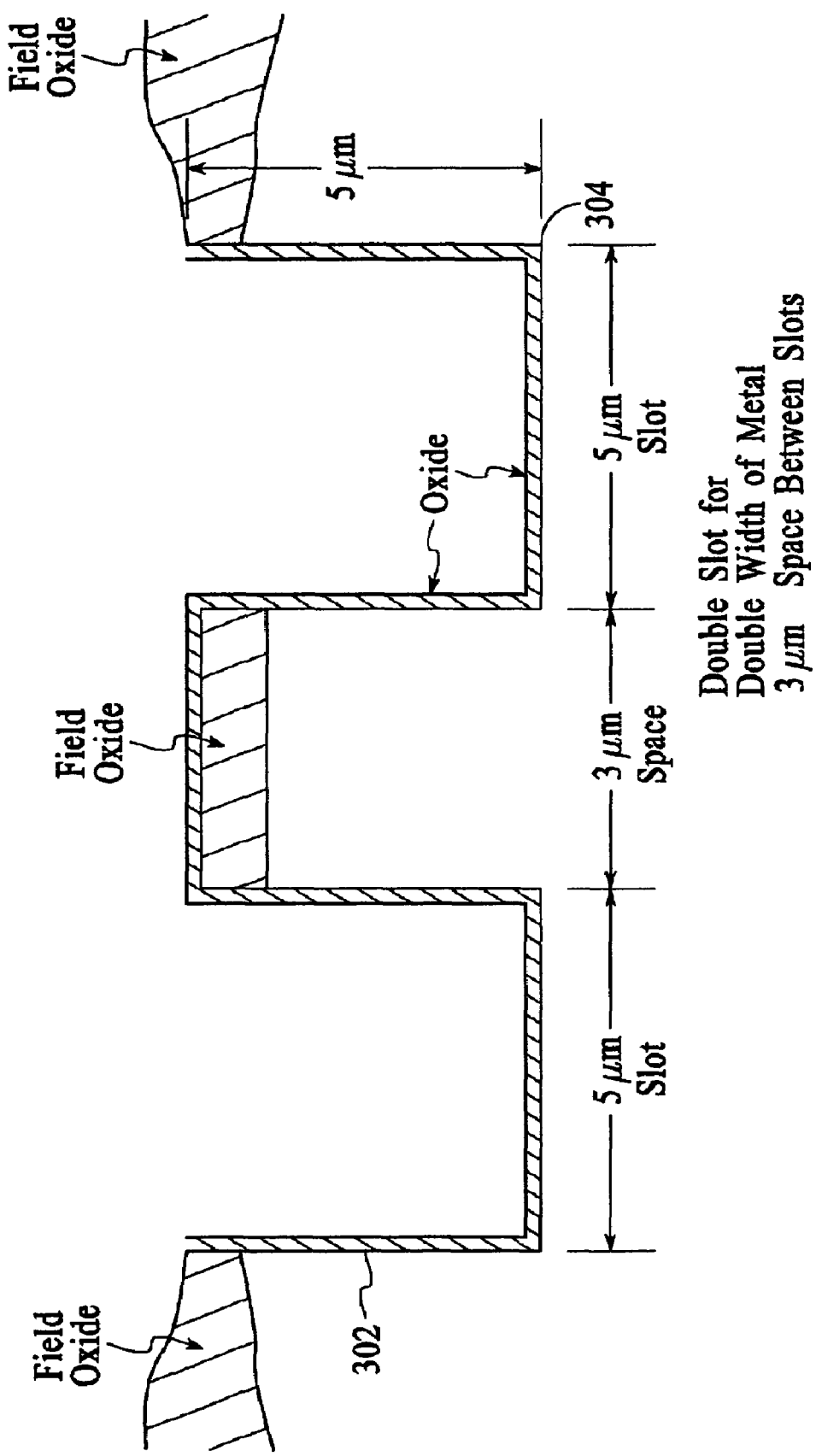
FIG. 5 illustrates oxidized slots in accordance with the present invention.

1) CVD Conformal Metal—FIG. 4 illustrates metal coverage 202 in a slot 200 utilizing CVD metal system to provide a conformed coating. The use of a CVD deposition system results in metal conforming to the shape of the slot. In this case metal is deposited, preferably 2.5 µm thick or the thickness that one is able to etch conveniently. The metal is 2.5 µm in the field and 5.0 µm in the slot due to the "folding" of the metal at a seam 203 in the slot as shown in FIG. 4. Metal deposited by a CVD metal system results in metal conforming to the shape of the slot. In the case where the aspect ratio is one, a deposition of metal x thick (where the slot width is 2x) results in the metal being 2x thick in the slot. This is due to the "folding" of the metal in the slot. For example, where the slot has a depth and width of 5 um (aspect ratio of 1.0) and 2.5 um of metal is deposited, the slot would be filled, since the 2.5 um of metal would result in the surfaces of the metal going up the sides and touching each other as shown in FIG. 4. This provides a major advantage, since one receives 2x thickness of metal in the slots and only requires etching 1x of metal in the field as shown. In order to receive this optimized folding, an aspect ratio of one must be used and the metal deposited is one-half the thickness of the slot depth.

2) Standard Sputter Metal—While the method of depositing metal with CVD metal is quite straightforward, some companies do not have CVD metal and would employ standard sputtering equipment. Sputter deposition provides some additional advantages over the CVD approach, as will be discussed herein.

Figure 6:
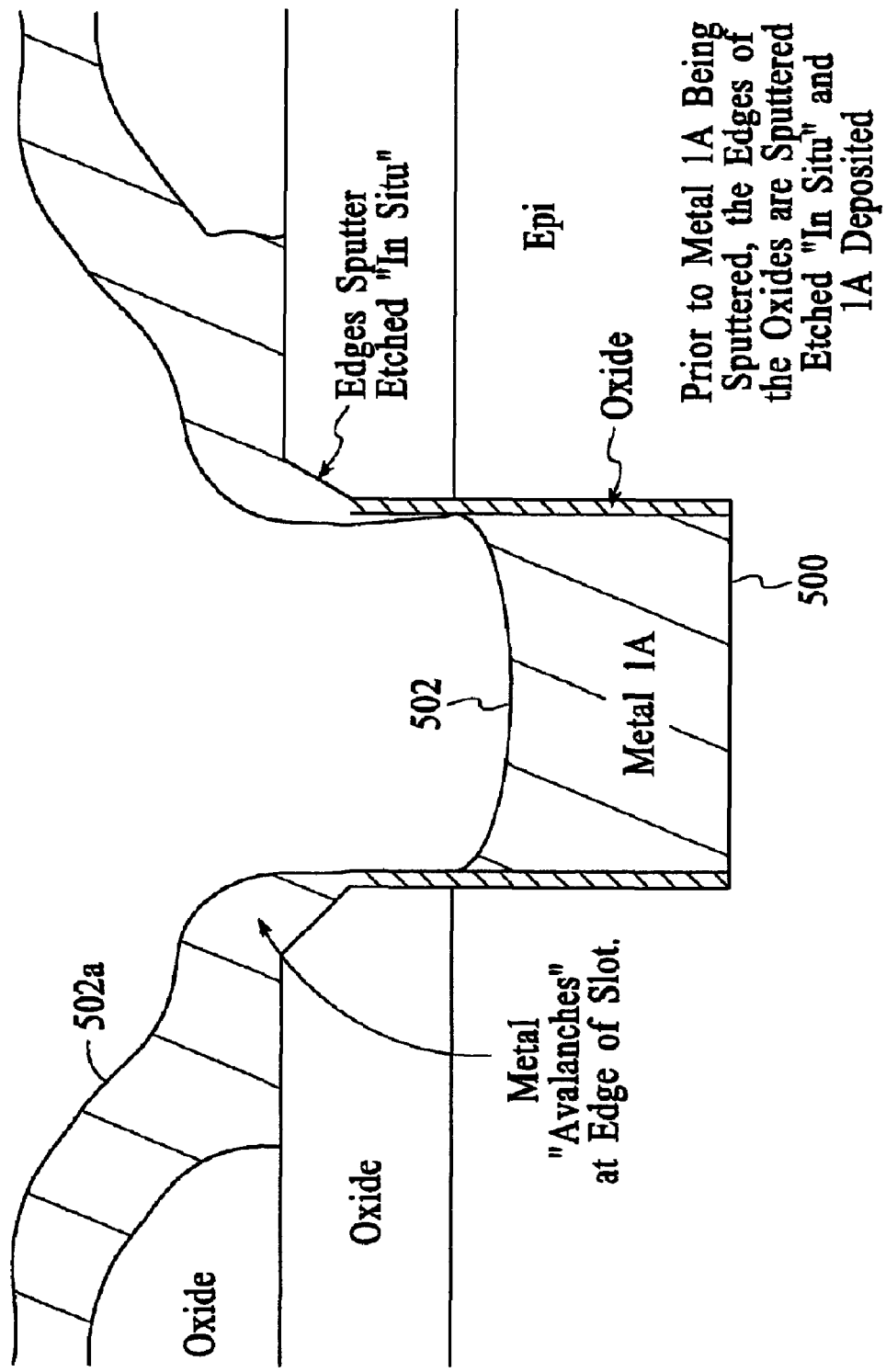
FIG. 6 illustrates the first metal after metal is sputtered into the slot as well as on the surface of the wafer.
Figure 7:
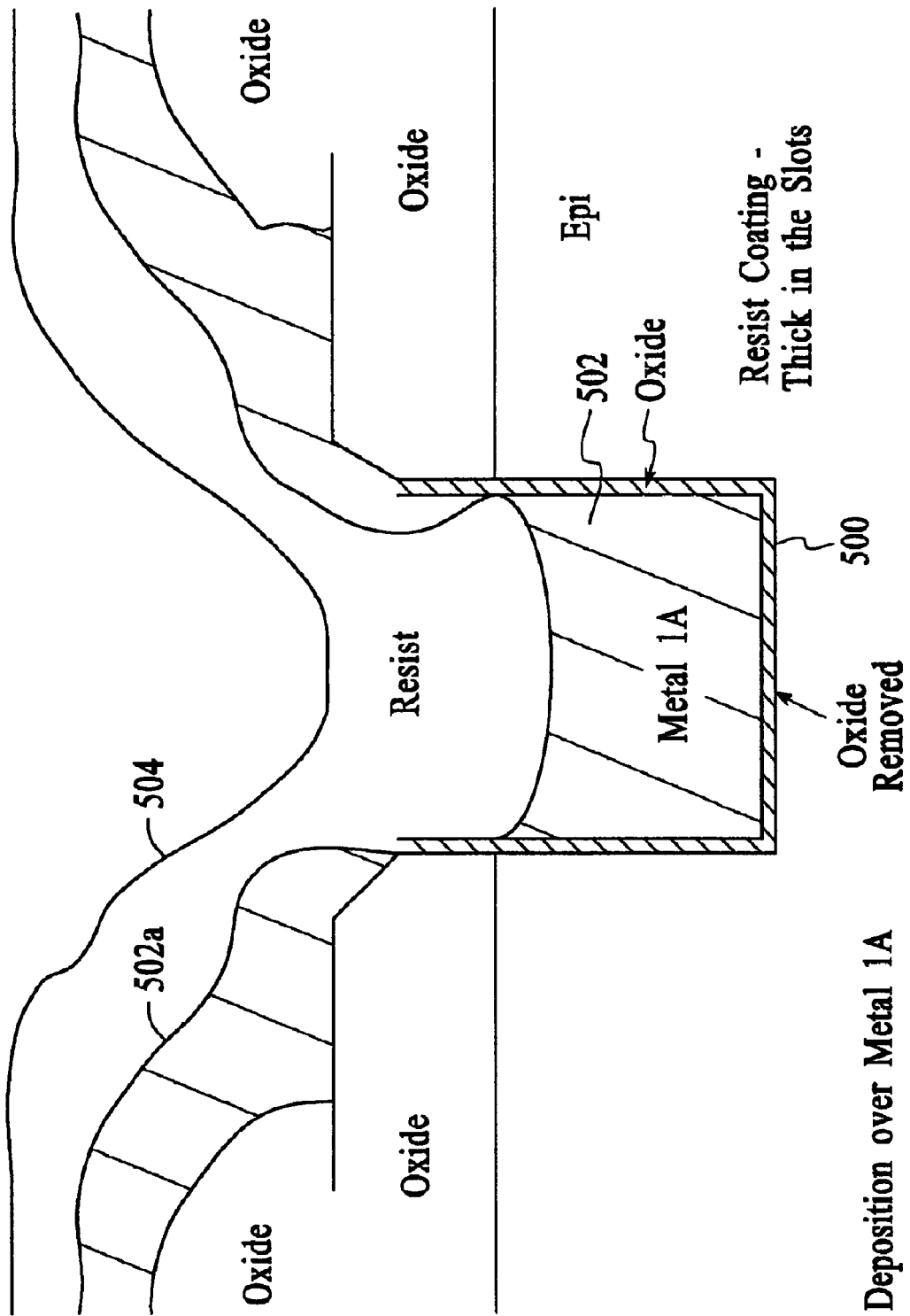
FIG. 7 illustrates a resist coating the wafer over the first metal and resist is thicker in the slot.
Figure 8:
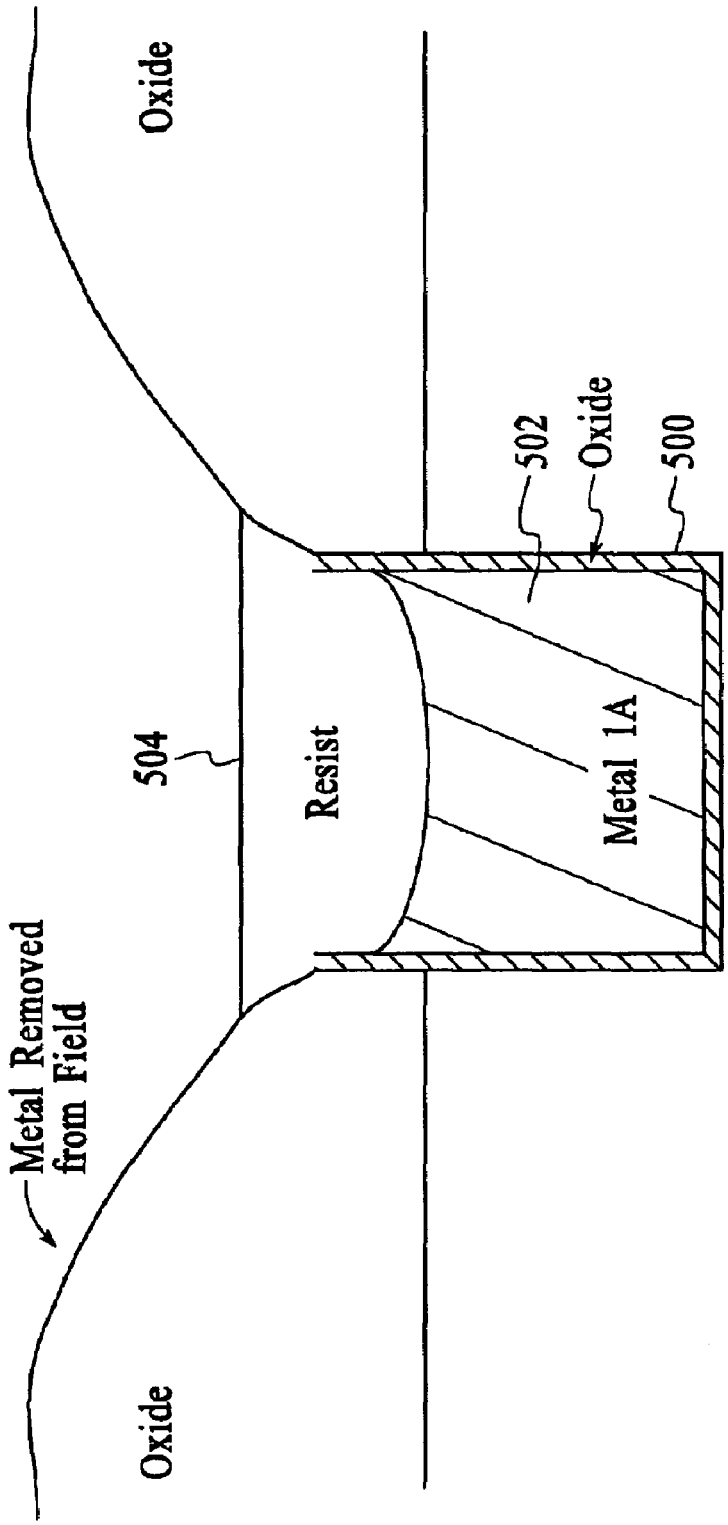
FIG. 8 shows the first metal (1A) after planarization etch, which removes the resist and metal in the field, leaving residual resist still in the slots above the first metal. The resist is then stripped.
Figure 9:
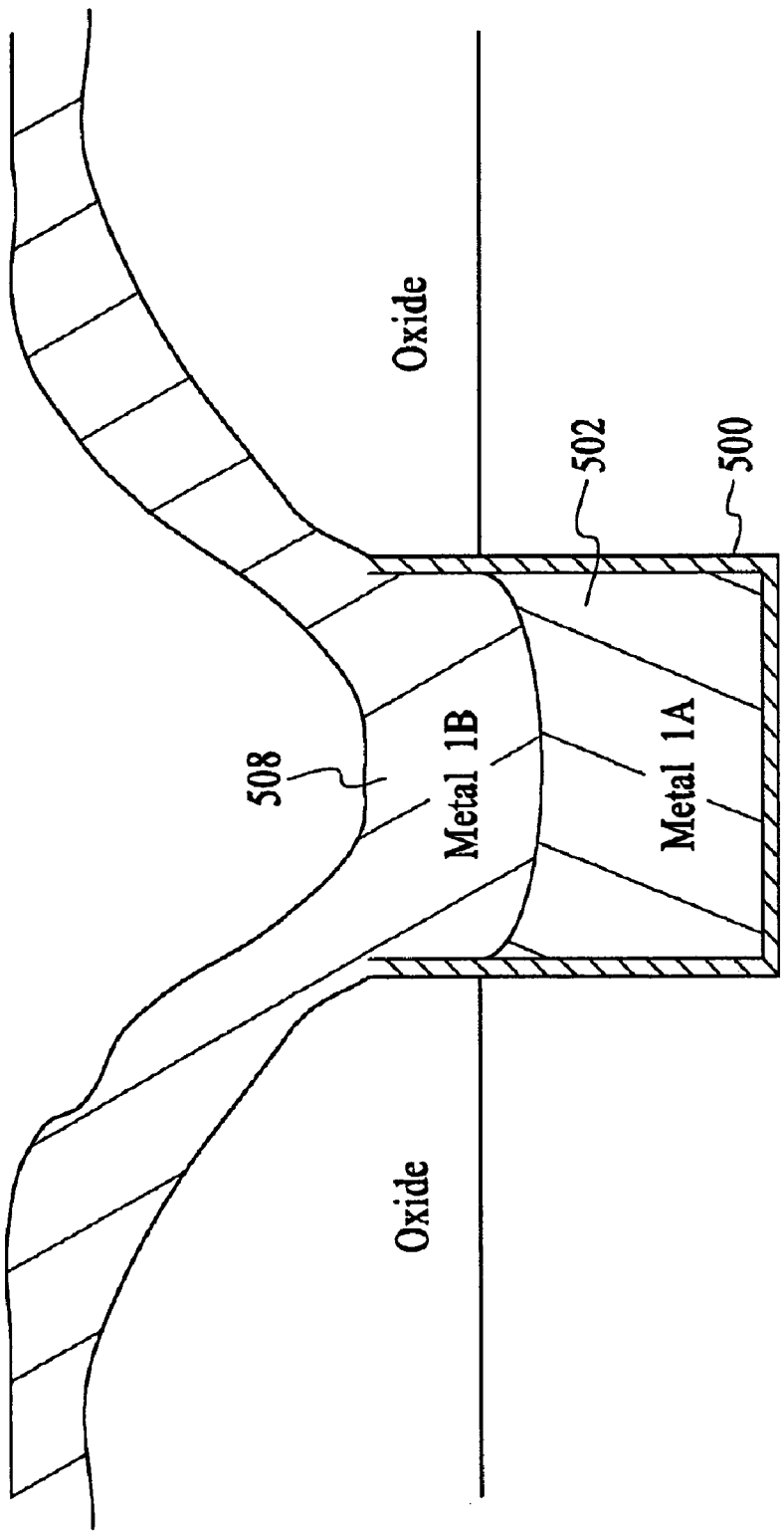
FIG. 9 shows a second deposition of metal (1B) as deposited and resist coating the wafer over the second metal and in the field and over the two metal layers in the slots.
Figure 10:
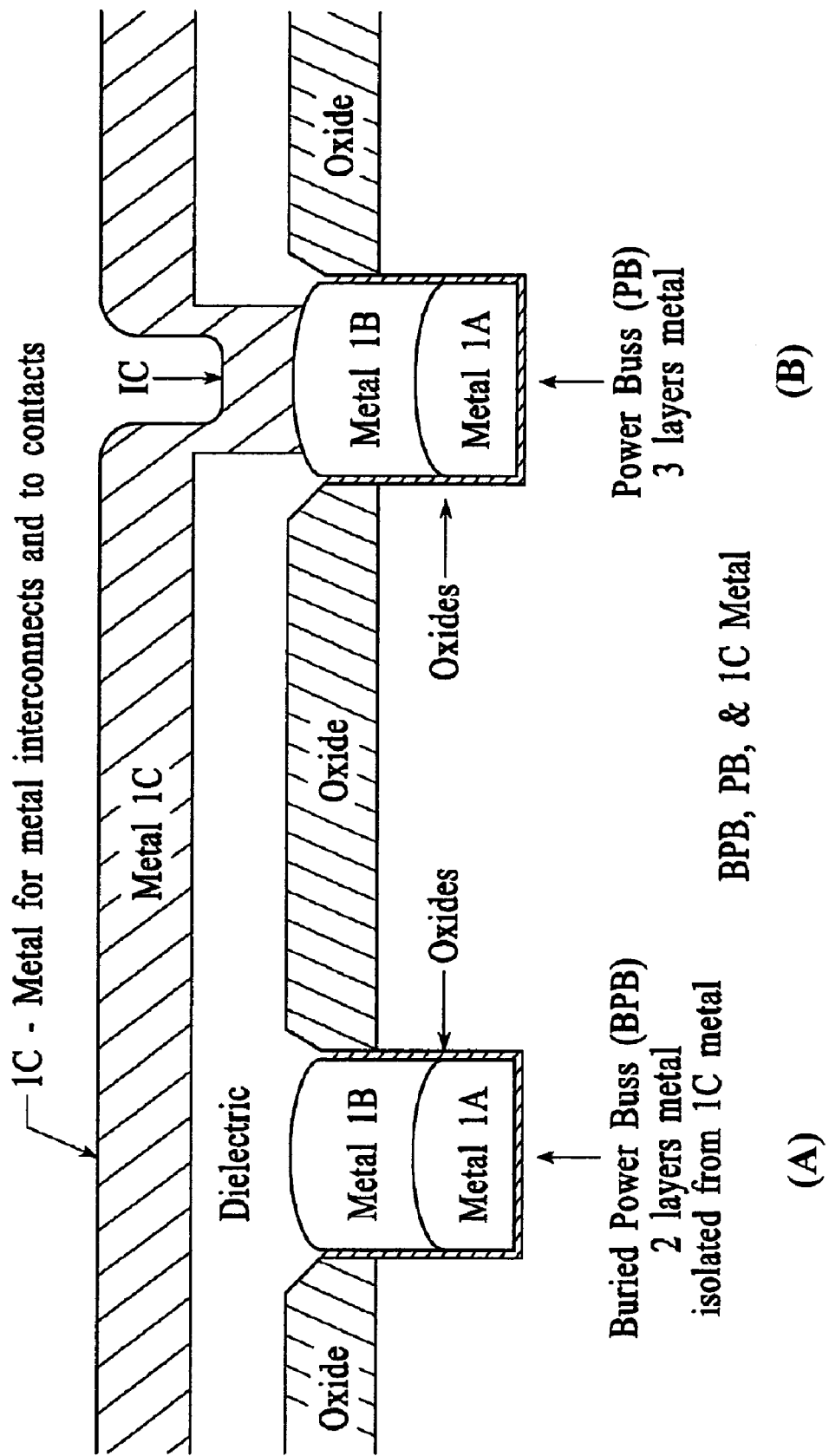
FIG. 10 shows metals 1A and 1B after resist is stripped and a dielectric deposited over metal 1A and 1B. These two metals make up the buried power buss (BPB).

Use of sputtering requires multiple depositions for functions requiring thick metal. The advantage to this approach is that the thickness of the metal doesn't have to relate directly to the width and depth of the slots. Metal would normally be deposited in increments of 1.5 um to 2.5 um thickness. An example would be a device where one wants 3.0 um of metal in a slot. In this case, one deposition of 1.5 μm of metal is deposited (Metal 1A). This leaves the slots approximately half full, as shown in FIG. 6. Photo resist is spun on the wafers as shown in FIG. 7 and they are planarized by CMP or dry etching (for example). This removes the metal in the fields and leaves the slots with resist still remaining over the metal in the slots, as shown in FIG. 8. The resist is stripped and another 1.5 um of metal is deposited (Metal 1B) as shown in FIG. 9. This fills the slots and leaves 1.5 um of metal in the field. The field metal is removed by planarizing the resist using CMP or dry etch or other method, and the resist in the slots being stripped. A dielectric is deposited over the wafers, as shown in FIG. 10; thus providing the buried power buss (BPB). This is followed by the normal contact-opening procedure. The contact mask also includes opening selected slots, as well as the normal contact openings.

Figure 11:
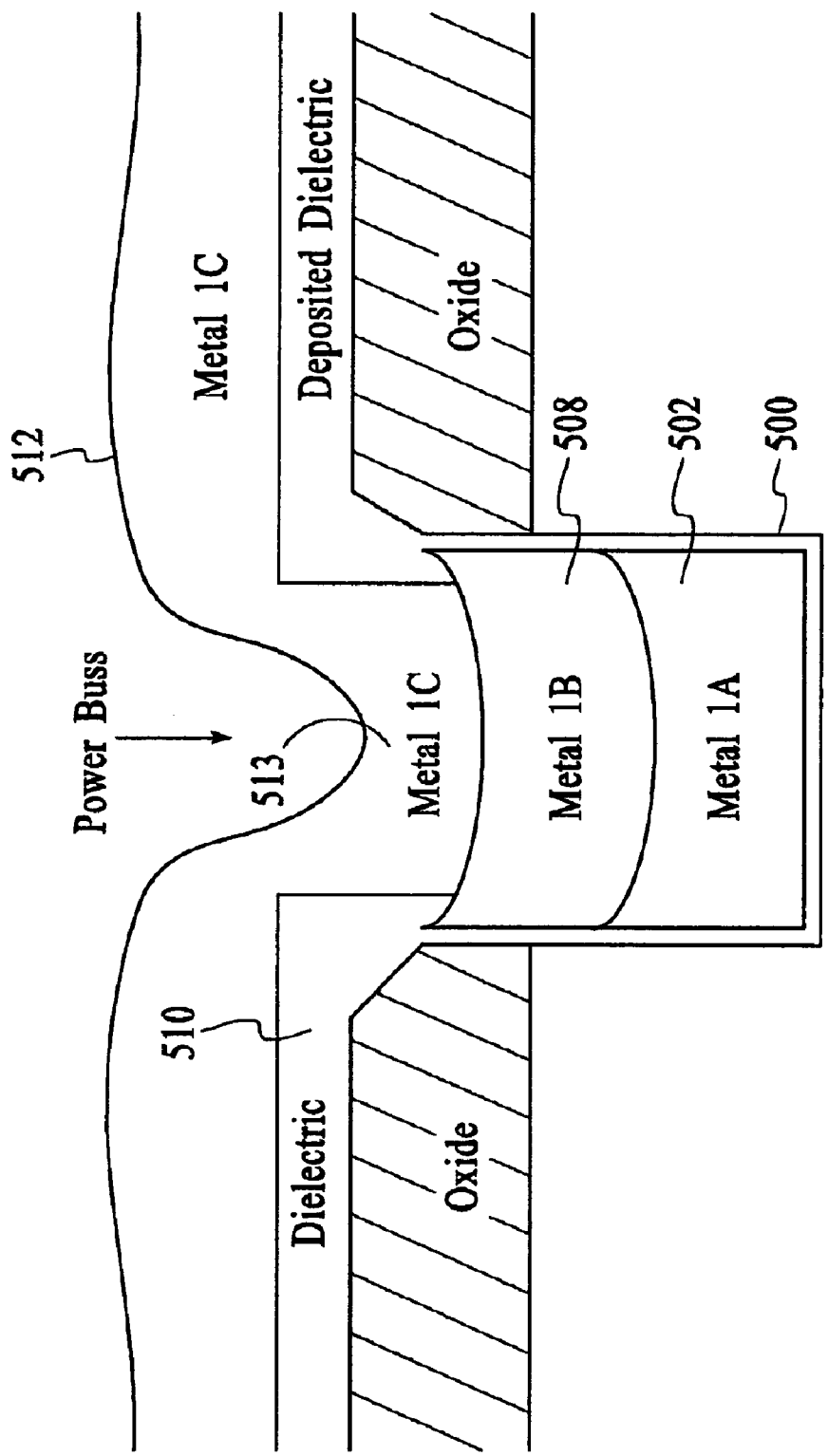
FIG. 11 illustrates contact masking to open the dielectric over metal 1B in select spots on the device and metal 1C deposited on metal 1B by sputter-deposition completing first metal. This is equivalent to the power buss (PB) and contains all three layers (1A, 1B, 1C) of deposited metal as shown in FIG. 10B.

This is followed by a third deposition of metal (Metal 1C). This provides metal in the slot areas that were opened during contact opening, with 3 um plus the 1C metal thickness (Metal 1A, 1B, & 1C) and serves as the power buss (PB) as shown in FIGS. 10 and 11. In the field the metal thickness is the 1C metal as shown in 10A. Where slots were not opened during the contact masking, one has the buried power buss (BPB) as shown in FIG. 10. In this buried power buss (BPB) the metal thickness is 1A and 1B, and is buried away from Metal 1C by the dielectric between Metal 1B and 1C. From this figure one is able to see how the buried power buss (BPB) (Metal 1A & 1B) can be routed away from the power buss (PB) that contains 1A, 1B and 1C metal layers. In this respect the buried power buss (BPB) is independent of the thicker metal of the power buss (PB) containing the three thicknesses of metal. The power buss (PB) cross section is shown in FIG. 11. Notice, when the contact mask was used to open dielectrics, the dielectric above the PB was removed thus allowing the 1C metal to make contact to the 1B metal thus providing three levels of metal in the Power Buss. The wafers now receive the standard metal interconnect masking and etching of this last thin metal (1C). Note, although three metals are deposited; only the last needs patterning. All the other previous metal removals were accomplished using maskless, non critical procedures. In this example, there is 4.5 um of metal in the power buss (PB) (1A, 1B, & 1C), 1.5 μm of metal (1C) in the interconnect areas, and 3.0 um of metal (1A, 1B) in the buried power buss (BPB). The buried power buss (BPB) is located in those areas where the slots were not opened during the contact mask. It is very important to note that with only etching of the thin metal (1C), one has three metal layers to choose from; 1C for interconnect of low current, buried power buss (BPB) with 1A and 1B metal thickness for high currents, and the power buss (PB) with all three thicknesses, thus, a triple metal technology with only one thin metal pattern and etching. Following is a typical matrix showing the various slot depths and the number of metal depositions, the remaining field metal thickness, the thickness of the metal in the buried power buss (BPB), and the thickness of the metal in the power buss (PB) using a 1.5 μm metal deposition for each of the depositions. A similar matrix could be made using a different thickness of metal for the three depositions.

| Matrix II | | | | |
|---|---|---|---|---|
| Slot depth | # of metal depositions | Field thickness | Buried Power Buss (BPB) | Power Buss (PB) |
| 3 μm | 3 | 1.5 μm | 3 μm | 4.5 μm |
| 5 μm | 4 | 1.5 μm | 5 μm | 6.5 μm |
| 7 μm | 5 (one dep of 2.0 μm) | 1.5 μm | 7 μm | 8.5 μm |
| 8 μm | 6 | 1.5 | 7.5 μm | 9.0 μm |

As can be seen by this matrix, one only has to pattern the last layer field thickness of 1.5 μm for any slot depth and metal thickness. The slot depth provides the thick buried power buss (BPB) and thicker power buss (PB) due to the number of depositions times the thickness of the metal being deposited. In each case, one only has to pattern etch the thin final metal layer while achieving the very thick burial power buss (BPB) and thicker power buss (PB). This matrix could be replaced by a similar one, using 2.5 um of metal for each of the depositions. This thicker metal would be used where it is desired to have even thicker buried power buss (BPB) metal and final metal, and still have the capability of only etching the final metal deposition, which could be 2.5 microns or a thinner metal that is easier to etch. For this approach, the slots are required to be approximately twice the depth, while maintaining the same aspect ratio.

Carrying the High Current

Whereas the standard approach throughout the semiconductor industry carries the high current on the final metal, this approach carries the high current on the buried power buss (BPB) with its thick metal or the power buss (PB) with its even thicker metal. The industry's standard approach requires carrying the high current on the final layer, because the metal layers prior to the final layer are required to be very thin metal. The prior metals need to be thin to allow subsequent metal layers to not have to cross a large dielectrically covered metal step. This is to prevent metal breakage when going over the step. So, they are relegated to using the final metal as the thickest to resolve this issue. Even then, they are restricted to the thickness of metal they can etch and hold tolerances.

In the buried power buss (BPB) approach, the high current carrying layer is the buried power buss (BPB) which contains metal 1A and 1B or the power buss (PB) (1A, 1B and 1C), neither of which requires etching thick metal. In no case is metal required to cross over high steps and incur metal breakage while achieving these very thick metal layers, thus providing a more reliable approach.

It is important to note here that the equivalent of a triple-metal approach is achieved while only requiring the etching of one contact mask and the patterning of one metal layer. This eliminates a dielectric deposition, first contact mask, first metal deposition and patterning of first metal, which are required in the standard dual metal approach. Further steps are eliminated when compared to a triple metal approach. Since the buried power buss (BPB) approach results in triple metal, there are further reductions from a standard approach. Metal of all layers can be thicker than the standard approach, since the slots provide the medium for the metal structure and do not result in large steps that subsequent metal has to cross. Therefore, metal breakage of interconnects over steps is eliminated.

Achieving Maximum Benefit; Employing Parametric Advantages

The key to full benefit of this approach is achieved by integrating the buried power buss (BPB) into the various device structures to gain parametric advantages. Prior examples related to the isolation and to the sinker applications and their particular savings in space, temperature, time reduction, reduced process steps, reduced capacitance, reduced Ron, reduced Rout and others. Ron advantages are obtained by using the slots for the collector and emitter in bipolar, source and drain in CMOS, and the source and drain in lateral and vertical DMOS. Likewise, the use of this technique with the emitters of vertical NPN transistors and lateral PNP transistors results in improved parameters, such as: increased beta, beta over a wider current range, reduced de-biasing, higher frequency response, lower Ron, lower resistance to ground and others. Use in lateral and vertical DMOS results in increased sustaining current and voltage, higher snap back voltage, lower Ron, Lower capacitance and others. One needs to examine each technology being employed and determine how the buried power buss (BPB) can be integrated into the active regions, the passive regions, and field regions to provide a device parameter advantage, space saving advantage, or process complexity reduction.

Intergrated Circuit Connections

Figure 13:
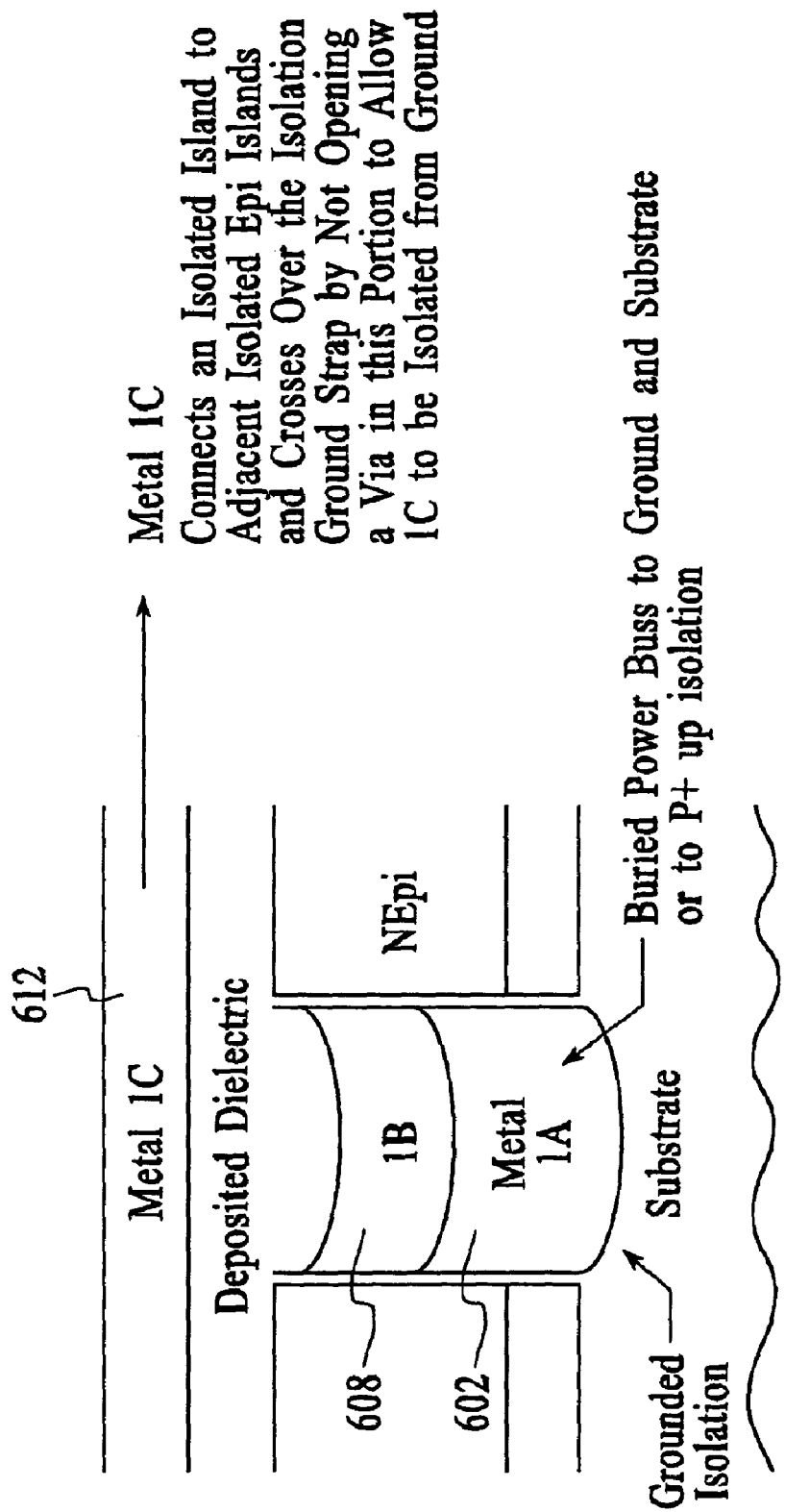
FIG. 13 shows a typical side view of the metal as shown between two adjacent "epitaxial islands" that are isolated by the ground strap formed by the BPB with a crossover provided by the 1C.

This method of buried power buss (BPB) for integrated circuit parameter advantage and system connection provides direct contact of the metal grounding to the substrate, lowering the Ron of active devices and lowering ground noise. This grounded, oxide isolated, buried power buss (BPB) provides ground for isolated epitaxial islands of active and passive elements that are process isolated from each other; but need to be circuit connected to each other. The isolated epitaxial islands that contain the active and passive elements in the integrated circuits are connected by the buried power buss (BPB) and the 1C layer as shown as shown in FIGS. 10, 12 and 13. Note that the slots containing the 1A and 1B buried power buss (BPB), are isolated from the 1C metal. Therefore, metal can be connected from one isolated island of active devices to another using the 1C metal to cross over a buried power buss (BPB) line. To gain full advantage of low interconnect resistance, the metal interconnect can contain the buried power buss (BPB), or, power buss (PB) metal until it is ready to cross a ground line. At that point, the 1C crosses over the buried ground line being provided by the buried power buss (BPB), and using the dielectric between it and the buried power buss (BPB) to insulate it from the ground during crossing as shown in FIG. 13. All of these advantages come with reduced masking steps while eliminating long high-temperature processes.

This method results in interconnect sheet resistance being reduced by a factor greater than ten (10), compared to the present standard methods utilized by most of the industry. This results whether aluminum, silicon, or, copper is used. Although the approach discussed assumes the use of standard aluminum, aluminum-silicon, or, aluminum/silicon/copper; copper could be used.

Heat transfer is three orders of magnitude better than what is experienced in methods currently in use. This is due to the thick metal being directly contacted to the silicon substrate or through oxide to the silicon substrate. Heat transfer through silicon is three orders of magnitude better than through air, and transfer through oxide is approximately two magnitudes better than air.

The buried power buss (BPB) and related triple metal interconnect provides at least an order of magnitude better protection against electro-migration, due to the reduced current density and significantly improved heat transfer. This approach provides higher current and power dissipation prior to secondary breakdown of bipolar transistors as a result of the improvement in heat transfer.

SUMMARY

This description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In accordance with this invention a completely new methodology is presented whereby a slot approach is utilized to provide very significant improvements in parameters of active devices while providing a unique approach for providing low resistance interconnects. Parameter improvement has been discussed on several device incorporations of this approach. When used as an interconnect, the approach has the attributes of being able to provide a thick metal buss and the equivalent of a triple metal technology while only having to deposit and etch one thinner metal. A three metal technology is accomplished by providing slots, or trenches that are a function of the thickness of metal one wants in the power carrying metal busses. The thickness comes from folding the metal in the slots when using a CVD deposition metal system, or by multiple, maskless metal depositions when using a conventional metal sputtering system. Both of these methods of deposition result in metal that is at least five times the thickness of the interconnect metal and in most cases is some integer of the interconnect thickness, while only having to etch a thinner metal for the interconnect metal. Parametric and interconnect advantages are obtained while reducing the number and difficulty of the process steps involved and results in a greatly reduced die size. This approach results in oxide isolation without added steps, and allows one to drop the long time and high temperature junction isolation masking and diffusion process, as well as the sinker masking and diffusion. While doing this, it provides a direct, oxide-isolated, metal strap-to-ground, resulting in a lower resistance to ground than other approaches and improved isolation.

While a slot process in accordance with the present invention provides these major advantages for high power devices, its utilization is applicable for small high frequency devices providing low interconnect resistance, a direct short to the substrate for grounding, and a low Ron (on resistance) for both low and high power devices. The approach reduces capacitance and RC time constants for the low-power, high-frequency devices while reducing their die size. The approach provides higher gain and over a broader current due to reduction of de-biasing. Higher frequency response obtained on high frequency circuits such as those using current mode logic or emitter coupled logic. This approach is applicable to bipolar, CMOS, BiCMOS, DMOS, and specific devices within these and other technologies.

In a preferred embodiment, the interconnect method occurs at the end of the processing of the active areas. This is true for bipolar, CMOS, BiCMOS, BCD, vertical DMOS, and enhanced drift lateral DMOS. However, in order to gain parametric advantages available from this slot approach, the positioning of the slots within the integrated circuit must be taken into consideration prior to developing a mask set. Proper selection of where the slots will appear results in significant parametric advantages, as well as elimination of spacing between many elements within the integrated circuit. Ultimately, it results in a greatly reduced die size, and significant improvements in system speed. For power devices, it also results in reduced power dissipation, and improved heat transfer. Electromigration is essentially eliminated as a concern.

This approach also provides a major advantage in application-specific integrated circuits (ASICS), in that the circuits could receive their customizing as the very last layer of metal. For example, the ASIC, using this process, can be carried completely through buried power buss (BPB) metal, be tested for certain functions, have the 1C metal deposited, and the wafers kept at an inventory position, for final 1C metal patterning. In this manner, upon receiving an order for the ASIC, only this last thin metal needs to be patterned, thus reducing the turn around time of the product. This is a major advantage. Only prime wafers that have passed wafer sort for parameters will be held in inventory, thus limiting the exposure to the possibility that wafers pulled from inventory will fail final test. In addition, where most ASICS have first metal that is 6000 A to 8000 A, this approach with its 5 µm of metal provides improved parameters and a smaller die size with greater freedom in the selection of the customized layer that will follow.

This method results in interconnect sheet resistance being reduced by a factor of almost ten (10), compared to the present method utilized by most of the industry. Because of the low sheet resistance of the metal and other steps taken; this approach results in less de-biasing of high-current carrying portions of the device, such as the output power device, and thus results in higher beta gain at given voltages, or currents. Heat transfer is three orders of magnitude better than what is experienced in methods currently in use. The buried power bus (BPB) and related interconnect provides at least an order of magnitude better protection against electromigration compared to methods currently in use. The much thicker metal being carried out to the bonding pads results in improved bonding and higher reliability with less sensitivity to ESD effects. Additional benefits include higher current and power dissipation prior to secondary breakdown as compared to standard methods used in the industry. This effect comes about due to the large amount of metal buried throughout the device acting as a built in heat sink.

This buried power buss (BPB) approach results in a much smaller die and results in less loss due to defect densities, which are a function of die area. This combination of smaller die and fewer losses due to the smaller size, results in more gross die per wafer and much more net die per wafer. The smaller die allows products currently produced to be able to fit into smaller packages, thereby opening up new markets for a given function. Direct connection of ground to the silicon substrate, as well as heavy metal being utilized throughout the die results in improved heat sinking and allows for the die to be placed in packages where components previously could not operate due to high thermal impedance. Since this approach results in oxide isolation being provided by oxide isolated metal ground straps, higher frequency of operation is realized due to reduced capacitance for a given function. All this capability comes by providing only one slot mask while eliminating several masks and long and high temperature processes.

ADVANTAGES

1. Higher beta and beta over a wider range of collector current for lateral PNP transistors and vertical NPN transistors.

2. Significant reduction in the size of the PWELL and NWELL in CMOS devices due to truncation by the oxidized slots in the sources and drains at both ends of the wells.

3. Reduction of leakage of Schottky diodes through improved isolation and reduction of surface area.

4. Higher breakdown or sustaining voltages for all the devices and technologies listed above. Includes increased snap back voltage for CMOS devices due to reduction of bipolar coupling from the source through the PWELL to the substrate for PWELL devices and from the source through the NWELL to the substrate on NWELL devices.

5. Reduced leakage of buried diodes due to contact beneath the surface; i.e., reduces surface leakage component.

6. Provides significant advantages to circuit designer since grounding method eliminates much of the routing of ground metal interconnects that are normally on the top surface and have to be routed to avoid other metal on the top surface. Grounding in this method is done through the routing of the buried power buss (BPB) which is isolated from other metal layers or through direct contact to substrate at remote locations. This essentially eliminates all ground metal running along the top surface and provides great freedom to the circuit designer in his routing of other metal connections on the top surface.

7. Provides significant reduction of de-biasing in the emitters at high currents for vertical NPN and lateral PNP transistors.

8. Provides significant reduction of de-biasing of power nodes in bipolar CMOS, DMOS, BCD, BICMOS and FETS.

9. Provides lower interconnect resistance.

10. Provides lower interconnect RC time constant.

11. Provides for higher speed due to reduced spacings, reduced area, reduced de-biasing, reduced capacitance, reduced resistance, reduced base width on certain elements. Higher speed is also obtained through constant base width provided for lateral PNP's or lateral NPN's.

12. Provides improved electromigration by an order of magnitude.

13. Provides improved heat transfer by 2 to 3 orders of magnitude over junction isolated circuits, and damascene metal approaches that are on the top surface.

14. Allows for reduced critical dimensions of spacings between active and passive areas on masks and the subsequent processing of the silicon material (or other material); due to oxide isolation, and reduced time and temperature of processing. This results in a significant reduction in die size.

15. Provides a significant reduction in cost of fabrication due to reduced steps in process flow and reduced complexity of process.

16. Provides a significant reduction in cost of fabrication due to reduction in die size for a given function.

17. Provides metalized slots to ground at points where oxide is removed from slot bottoms prior to metal.

18. Direct metal to ground results in lower ground resistance.

19. Lower ground resistance results in lower ground noise and reduced coupling of noise within the circuit.

20. Power buss (PB) contains very thick metal located in oxide isolated slots that reduces power supply noise coupling within the circuit and system due to reduction in resistance and capacitance.

21. Oxide isolation provides lower intra-circuit capacitance coupling.

22. Reduces power supply noise and coupling due to low resistance and lower capacitance of power buss (PB) which is very thick metal in oxide isolated slots.

24. Provides triple metal with single metal processing. Eliminates the dielectrics and vias required for standard triple metal; only requiring one contact mask and one metal layer to be patterned and this is on thin metal.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The invention claimed is:

1. A method for providing an improved integrated circuit device comprising the steps of:
   providing active and passive areas in the substrate,
   providing a plurality of slots in the substrate after providing the active and passive areas,
   oxidizing the plurality of slots;
   providing metal in each of the plurality of slots,
   providing a dielectric coating over the slots;
   providing etched contacts in select areas remote from the location of the slots;
   providing an additional layer of metal that interconnects the etched contacts and the metal in the slots in select areas around the etched contacts, resulting in metal of three levels; and
   providing one level of the metal on a top surface in the substrate and two levels of the metal comprising a buried power buss (BPB).

2. The method of claim 1 wherein the providing steps comprising the step of providing three independent oxide isolated metal layers being of sufficient thickness to carry high current.

3. The method of claim 1 wherein active and passive areas are provided for bipolar, CMOS, BICMOS, DMOS and BCD technologies with improved properties.

4. The method of claim 1 wherein select slots are opened in the substrate prior to metal to allow the oxide to be removed from the bottom of slots that are to make ground contact to the substrate and metal contact to the buried metal to replace a sinker.

5. The method of claim 1 wherein three layers of metal are provided with only one layer of metal requiring masking and pattern etching.

6. The method of claim 1 whereby the slots are located to provide significant circuit advantages for the various technologies.

7. The method of claim 1 whereby three layers of isolated metal interconnect are formed while only requiring one layer of dielectric to be deposited and contact etched, versus standard triple metal processes which requires three layers of dielectric to be deposited and contact (or via) etched.

8. The method of claim 2 whereby a high current is carried on the buried power buss (BPB) and a third layer is for interconnection of low power circuitry.

* * * * *